(12) United States Patent
Haneda

(10) Patent No.: US 8,094,057 B2
(45) Date of Patent: Jan. 10, 2012

(54) A/D CONVERSION CIRCUIT, ELECTRONIC APPARATUS, AND A/D CONVERSION METHOD

(75) Inventor: Hideo Haneda, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 12/774,911

(22) Filed: May 6, 2010

(65) Prior Publication Data

US 2010/0283645 A1    Nov. 11, 2010

(30) Foreign Application Priority Data

May 7, 2009    (JP) .................... 2009-112511

(51) Int. Cl.
*H03M 1/34* (2006.01)
(52) U.S. Cl. ......... 341/162; 341/144; 341/161; 341/155
(58) Field of Classification Search .............. 341/155, 341/164, 161, 162, 122
See application file for complete search history.

(56) References Cited

U.S. PATENT DOCUMENTS

| 4,308,585 A | * | 12/1981 | Jordan | 358/1.16 |
| 4,764,750 A | * | 8/1988 | Kawada | 341/122 |
| 5,870,052 A | | 2/1999 | Dedic et al. | |
| 6,239,734 B1 | * | 5/2001 | Bae et al. | 341/164 |
| 6,351,231 B1 | * | 2/2002 | Price et al. | 341/155 |
| 6,608,580 B2 | * | 8/2003 | Hsueh | 341/155 |
| 2009/0040089 A1 | * | 2/2009 | Dosho et al. | 341/161 |

FOREIGN PATENT DOCUMENTS

JP    08-321779    12/1996

* cited by examiner

*Primary Examiner* — Jean Jeanglaude
(74) *Attorney, Agent, or Firm* — Harness, Dickey & Pierce, P.L.C.

(57) ABSTRACT

An A/D conversion circuit includes: a sample-and-hold circuit adapted to sample and hold an input signal to output a sampled signal; a control circuit adapted to output successive approximation data; a first D/A conversion circuit adapted to perform D/A conversion on the successive approximation data to output a first D/A output signal; a second D/A conversion circuit adapted to perform D/A conversion on time-varying code data to output a second D/A output signal; and a comparison circuit adapted to perform a process of comparing the first D/A output signal, and an addition signal of the sampled signal and the second D/A output signal, and to output a comparison result signal, wherein the control circuit has a successive approximation register to which register values are set in accordance with the comparison result signal, outputs successive approximation result data after all of the register values of the successive approximation register have been determined, and subtracts the code data from the successive approximation result data to output the result as A/D conversion data of the input signal.

9 Claims, 12 Drawing Sheets

A/D CONVERSION CIRCUIT, ELECTRONIC APPARATUS, AND A/D CONVERSION METHOD

BACKGROUND

1. Technical Field

The present invention relates to an A/D conversion circuit, an electronic apparatus, and an A/D conversion method.

2. Related Art

From the past, as an A/D conversion circuit for converting analog signals into digital data, there has been known a successive-approximation type A/D conversion circuit. The successive-approximation type A/D conversion circuit is provided with a comparison circuit, a successive-approximation register, and a D/A conversion circuit, and performs A/D conversion on the signal, which is obtained by sampling (performing a sample and hold operation on) an input signal, by the successive approximation action, thereby outputting the digital data. As a related art technology of such a successive approximation type A/D conversion circuit, there is known a technology disclosed in JP-A-8-321779.

In such an A/D conversion circuit, the most part of the conversion accuracy depends on the accuracy of the D/A conversion circuit. Further, when attempting to improve the accuracy of the D/A conversion circuit, the size of the circuit is enlarged due to the area of capacitors (in the case of a charge redistribution type) or the area of resistors (in the case of a ladder resistor type). On the other hand, if devices are added to the D/A conversion circuit in order for preventing the increase in the circuit size, then, there arises the problem that so-called missing code is caused due to an error of differential non-linearity or integral non-linearity.

SUMMARY

According to some aspects of the invention, there can be provided an A/D conversion circuit, an electronic apparatus, and an A/D conversion method capable of improving the A/D conversion characteristic.

An aspect of the invention relates to an A/D conversion circuit including a comparison circuit, a control circuit having a successive approximation register to which register values are set in accordance with a comparison result signal from the comparison circuit, and adapted to output successive approximation data, a first D/A conversion circuit adapted to perform D/A conversion on the successive approximation data from the control circuit to output D/A output signal corresponding to the successive approximation data, and a second D/A conversion circuit adapted to perform D/A conversion on time-varying code data to output a code signal corresponding to the code data, wherein the comparison circuit performs one of a process of comparing an addition signal of a sampled signal of an input signal and the code signal with the D/A output signal, and a process of comparing the sampled signal with an addition signal of the D/A output signal and the code signal, and the control circuit outputs output data obtained based on successive approximation result data of the successive approximation register and the code data as A/D conversion data of the input signal.

According to the aspect of the invention, the successive approximation data from the control circuit having the successive approximation register is input to the first D/A conversion circuit, and the D/A output signal corresponding to the successive approximation data is output. Further, the time-varying code data is input to the second D/A conversion circuit, and the code signal corresponding to the code data is output. Then, a process of comparing an addition signal of a sampled signal of an input signal and the code signal with the D/A output signal, or a process of comparing the sampled signal with an addition signal of the D/A output signal and the code signal is performed. Then, the output data obtained based on the successive approximation result data and the code data is output as the A/D conversion data of the input signal. Further, in a certain aspect of the invention, there are provided a sample-and-hold circuit adapted to sample and hold an input signal to output a sampled signal, a control circuit adapted to output successive approximation data, a first D/A conversion circuit adapted to perform D/A conversion on the successive approximation data to output a first D/A output signal, a second D/A conversion circuit adapted to perform D/A conversion on time-varying code data to output a second D/A output signal, and a comparison circuit adapted to perform a process of comparing the first D/A output signal, and an addition signal of the sampled signal and the second D/A output signal, and to output a comparison result signal, and the control circuit has a successive approximation register to which register values are set in accordance with the comparison result signal, outputs successive approximation result data after all of the register values of the successive approximation register have been determined, and subtracts the code data from the successive approximation result data to output the result as A/D conversion data of the input signal. Further, in a certain aspect of the invention, there are provided a sample-and-hold circuit adapted to sample and hold an input signal to output a sampled signal, a control circuit adapted to output successive approximation data, a first D/A conversion circuit adapted to perform D/A conversion on the successive approximation data to output a first D/A output signal, a second D/A conversion circuit adapted to perform D/A conversion on time-varying code data to output a second D/A output signal, and a comparison circuit adapted to perform a process of comparing the sampled signal, and an addition signal of the first D/A output signal and the second D/A output signal, and to output a comparison result signal, and the control circuit has a successive approximation register to which register values are set in accordance with the comparison result signal, outputs successive approximation result data after all of the register values of the successive approximation register have been determined, and adds the code data to the successive approximation result data to output the result as A/D conversion data of the input signal. According to the configurations described above, the code shift becomes to be performed in accordance with the time-varying code data, thus the characteristic of the A/D conversion can be improved.

Further, according to another aspect of the invention, it is also possible that denoting a minimum resolution of the first D/A conversion circuit as RS1, and a minimum resolution of the second D/A conversion circuit as RS2, $RS2 \geqq RS1$ is satisfied.

According to the configuration described above, it becomes possible to perform the addition process of the code signal with an amplitude being equal to or larger than the minimum resolution RS1 of the first D/A conversion circuit to realize the code shift.

Further, according to the aspect of the invention, it is also possible that a code data generation section adapted to generate the code data and then output the code data to the second D/A conversion circuit is provided, and the code data generation section outputs the data taking a value varying every A/D conversion timing or every plurality of A/D conversion timings within a predetermined data range as the code data.

According to the configuration described above, the addition process of the code signal corresponding to the code data taking the value varying every A/D conversion timing or every plurality of A/D conversion timings is performed, and thus the code shift is realized. Thus, it becomes possible to temporally diffuse, for example, deterioration of the DNL characteristic to the codes around to thereby improve the characteristic of the A/D conversion.

Further, according to the aspect of the invention, it is also possible that the first D/A conversion circuit and the second D/A conversion circuit are each a charge redistribution D/A conversion circuit.

It should be noted that it is also possible to realize a part or the whole of the first and second D/A conversion circuits with a ladder circuit.

Further, according to the aspect of the invention, it is also possible that the first D/A conversion circuit includes a first capacitor array section having a plurality of capacitors having one ends connected to a comparison node of the comparison circuit, a first switch array section having a plurality of switch elements, which is connected to the other ends of the respective capacitors of the first capacitor array section, and on which switching control is performed based on higher-bit data of the successive approximation data, a first series capacitor disposed between the comparison node and a first node, a second capacitor array section having a plurality of capacitors having one ends connected to the first node, and a second switch array section having a plurality of switch elements, which is connected to the other ends of the respective capacitors of the second capacitor array section, and on which switching control is performed based on lower-bit data of the successive approximation data, and the second D/A conversion circuit includes a second series capacitor disposed between the comparison node and a second node, a third capacitor array section having a plurality of capacitors having one ends connected to the second node, and a third switch array section having a plurality of switch elements, which is connected to the other ends of the respective capacitors of the third capacitor array section, and on which switching control is performed based on the code data.

By using the first D/A conversion circuit having the configuration described above, it becomes possible to achieve higher bit A/D conversion while suppressing increase in the circuit area to the minimum. Further, by using the second D/A conversion circuit having the configuration described above, it becomes possible to realize the process of comparing the sampled signal with the addition signal of the D/A output signal and the code signal.

Further, according to the aspect of the invention, it is also possible that a code data generation section adapted to generate the code data and then output the code data to the second D/A conversion circuit is provided, and the code data generation section outputs the data taking a value varying every A/D conversion timing or every plurality of A/D conversion timings within a data range of the lower-bit data of the successive approximation data as the code data.

According to the configuration described above, the code shift can be realized by varying the code signal within the range being equal to or larger than the voltage corresponding to 1 LSB of the successive approximation data.

Further, according to the aspect of the invention, it is also possible that the control circuit performs the process of subtracting the code data from the successive approximation result data of the successive approximation register in the case in which the comparison process between the addition signal of the sampled signal and the code signal, and the D/A output signal is performed.

According to this configuration, by performing the subtraction process of the code data in the case in which the comparison process between the addition signal of the sampled signal and the code signal, and the D/A output signal, it become possible to output appropriate A/D conversion data.

Further, according to the aspect of the invention, it is also possible that the control circuit performs the process of adding the code data to the successive approximation result data of the successive approximation register in the case in which the comparison process between the sampled signal, and the addition signal of the D/A output signal and the code signal is performed.

According to this configuration, by performing the adding process of the code data in the case in which the comparison process between the sampled signal, and the addition signal of the D/A output signal and the code signal, it becomes possible to output the appropriate A/D conversion data.

Further, another aspect of the invention relates to an electronic apparatus including any one of the A/D conversion circuits described above.

Further, still another aspect of the invention relates to an A/D conversion method in a successive approximation A/D conversion circuit having a comparison circuit, a successive approximation register, and a D/A conversion circuit, the method including the steps of generating a code signal corresponding to time-varying code data, performing one of a process of comparing an addition signal of a sampled signal of an input signal and the code signal with a D/A output signal from the D/A conversion circuit, and a process of comparing the sampled signal with an addition signal of the D/A output signal and the code signal, and outputting output data obtained based on successive approximation result data from the successive approximation register and the code data as A/D conversion data of the input signal.

According to this aspect of the invention, the code signal corresponding to the code data is generated, and the process of comparing the addition signal of the sampled signal of the input signal and the code signal with the D/A output signal, or the process of comparing the sampled signal with the addition signal of the D/A output signal and the code signal is performed. Then, the output data obtained based on the successive approximation result data and the code data is output as the A/D conversion data of the input signal. According to the configurations described above, the code shift becomes to be performed in accordance with the time-varying code data, thus the characteristic of the A/D conversion can be improved.

BRIEF DESCRIPTION OF THE DRAWINGS

The invention will be described with reference to the accompanying drawings, wherein like numbers reference like elements.

DESCRIPTION OF AN EXEMPLARY EMBODIMENT

Hereinafter, a preferred embodiment of the invention will be described in detail. It should be noted that the present embodiment explained below does not unreasonably limit the content of the invention as set forth in the appended claims, and all of the constituents set forth in the present embodiments are not necessarily essential as means for solving the problems of the invention.

1. Configuration

Figure 1:
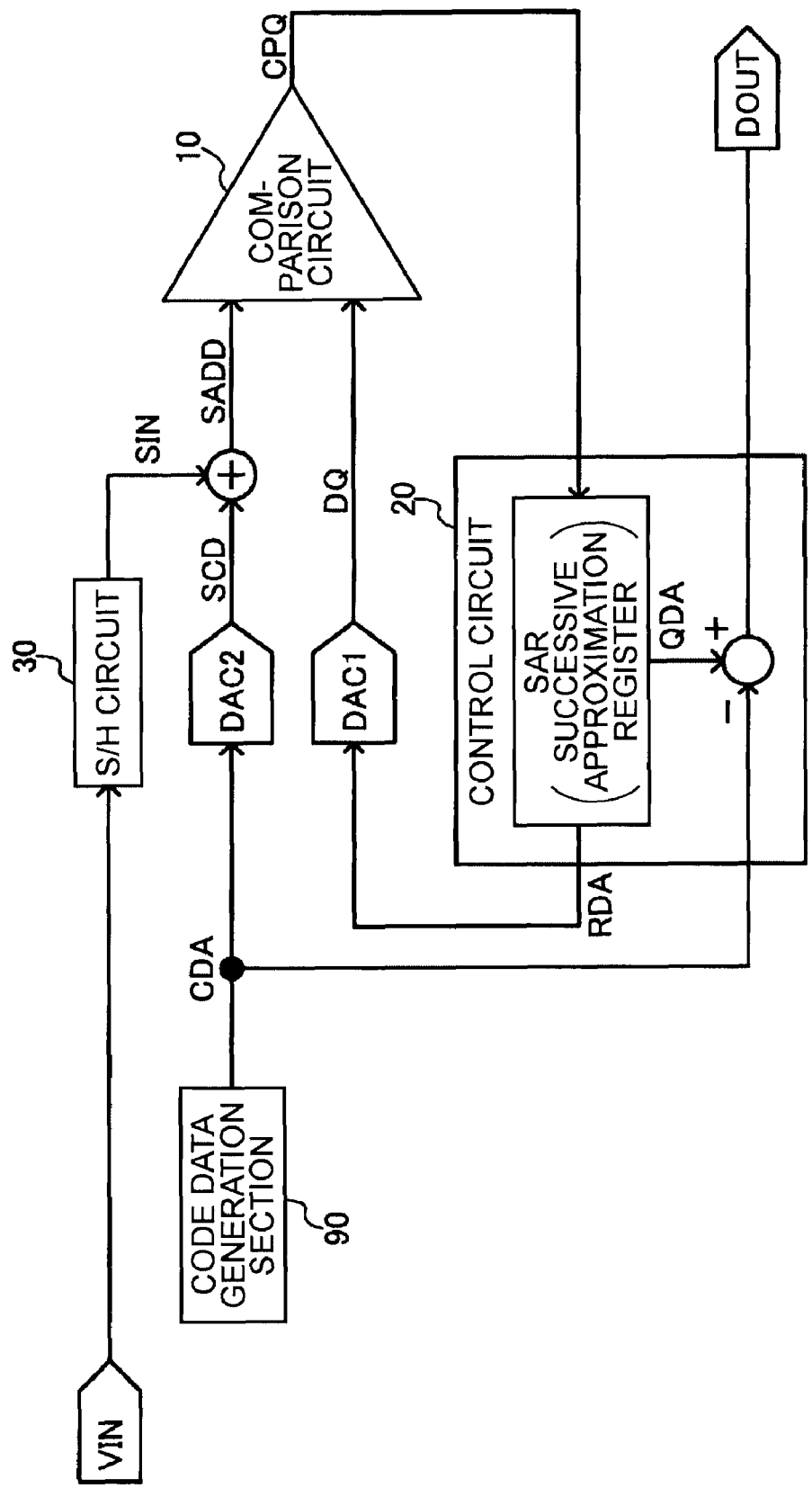
FIG. 1 is a diagram showing a configuration example of an A/D conversion circuit according to an embodiment of the invention.

FIG. 1 shows a configuration example of an A/D conversion circuit according to the present embodiment. The A/D conversion circuit includes a comparison circuit 10, a control circuit 20, a first D/A conversion circuit DAC1, and a second D/A conversion circuit DAC2. Further, the A/D conversion circuit can include a sample-and-hold (S/H) circuit 30 and a code data generation section 90.

It should be noted that the configuration of the A/D conversion circuit according to the present embodiment is not limited to the configuration shown in FIG. 1, but various practical modifications such as elimination of some of the constituents or addition of other constituents are possible. For example, it is also possible to eliminate the constituent corresponding to the S/H circuit 30, and to provide the D/A conversion circuit with a sample and hold function for the input signal VIN. Further, it is also possible to eliminate the constituent corresponding to the code data generation section 90, and to input the code data CDA directly from the outside.

The comparison circuit 10 is realized with a comparator (e.g., a comparator with a hysteresis function), and performs a comparing process between a signal SADD and a signal DQ.

The control circuit 20 has a successive approximation register (SAR) and outputs successive approximation data RDA (D/A input data). The successive approximation register SAR is a register having a register value set in accordance with a comparison result signal CPQ from the comparison circuit 10. For example, when the comparison circuit 10 performs a successive approximation process from the MSB to the LSB, the result ("1" or "0") of the process at each bit is stored as the register value of the successive approximation register SAR.

It should be noted that the control circuit 20 can also perform control process of each circuit block of the A/D conversion circuit. For example, the control circuit 20 performs on/off control of the switch elements (a switch array) included in the D/A conversion circuits DAC1, DAC2.

The D/A conversion circuit DAC1 performs the D/A conversion of the successive approximation data RDA from the control circuit 20. Then, the D/A conversion circuit DAC1 outputs the D/A output signal DQ (an analog signal obtained by performing the D/A conversion on the RDA, and also referred to as a first D/A output signal) corresponding to the successive approximation data RDA. The D/A conversion circuit DAC1 can be of a charge redistribution type using a capacitor array, or partially or wholly of a ladder resistor type.

The D/A conversion circuit DAC2 performs D/A conversion on the code data CDA. Then, the D/A conversion circuit DAC2 outputs a code signal SCD (a signal obtained by performing D/A conversion on the code data CDA, also referred to as a second D/A output signal) corresponding to the code data CDA. Here, the code data CDA is time-varying data (digital data varying every predetermined timing). Specifically, the code data CDA is data taking a value varying every A/D conversion timing or every plurality of A/D conversion timings within a predetermined data range.

It should be noted that the data range in this case is a range having first digital data as the upper limit value and second digital data as the lower limit value. The A/D conversion timing is, for example, a timing corresponding to each of A/D conversion periods for converting an analog signal into digital data.

The S/H (sample and hold) circuit 30 is a circuit for sampling and holding the input signal VIN to be an object of the A/D conversion. It should be noted that in the case of the charge redistribution type, the function of the S/H circuit 30 can be realized by the D/A conversion circuit.

The code data generation section 90 generates the code data CDA, and then outputs the code data CDA to the D/A conversion circuit DAC2. For example, the code data generation section 90 outputs the code data CDA taking a value varying every A/D conversion timing or every plurality of A/D conversion timings within a predetermined data range. Specifically, the code data generation section 90 outputs the code data CDA taking a value varying every A/D conversion timing or every plurality of A/D conversion timings within a data range of lower bit data of the successive approximation data.

Then, in the present embodiment, the comparison circuit 10 performs a process of comparing an addition signal SADD, which is obtained by adding a sampled signal SIN (a signal obtained by sampling and holding the input signal VIN) of the input signal VIN and the code signal SCD to each other, and the D/A output signal DQ with each other. Specifically, the comparison circuit 10 compares the addition signal SADD (an addition voltage) input to a first input terminal and the D/A output signal DQ (a D/A conversion voltage) input to a second input terminal with each other. It should be noted that in, for example, the case of the charge redistribution type, the comparison circuit 10 performs a process of comparing the sampled signal SIN and an addition signal obtained by adding the D/A output signal DQ and the code signal SCD with each other. For example, the comparison circuit 10 compares the sampled voltage of the sampled signal SIN and the addition voltage, which is obtained by adding the signals DQ and SCD, with each other.

Then, the control circuit 20 outputs output data DOUT obtained based on successive approximation result data QDA (the determinate data) from the successive approximation register SAR and the code data CDA, as A/D conversion data of the input signal VIN. For example, in the case in which the comparison process between the addition signal SADD of the sampled signal SIN and the code signal SCD, and the D/A output signal DQ is performed, the control circuit 20 performs a process of subtracting the code data CDA from the successive approximation result data QDA of the successive approximation register SAR. On the other hand, in the case in which a comparison process between the sampled signal SIN and the addition signal obtained by adding the D/A output signal DQ and the code signal SCD is performed as in the case of the charge redistribution type described later, the control circuit 20 performs a process of adding the code data CDA to the successive approximation result data QDA.

Then, the operation of the present embodiment will be explained taking the case in which the number of bits of the A/D conversion is eight as an example.

Firstly, the S/H circuit 30 performs the sample and hold operation on the input signal VIN to output the sampled signal SIN. Further, the code data generation section 90 outputs the code data CDA with an arbitrary value within a predetermined data range (e.g., 0000 through 1111), and the D/A conversion circuit DAC2 outputs the code signal SCD corresponding to the code data CDA.

The control circuit 20 outputs the successive approximation data RDA of, for example, 10000000 with the MSB thereof set to be "1," and the D/A conversion circuit DAC1 outputs the D/A output signal DQ corresponding to the successive approximation data RDA.

Then, the comparison circuit 10 compares the voltage of the signal SADD obtained by adding the code signal SCD to the sampled signal SIN and the voltage of the D/A output signal DQ with each other, and then outputs the comparison result signal CPQ taking a value of "1" or "0." For example, the comparison circuit 10 outputs "1" if the voltage of the signal DQ is higher than the voltage of the signal SADD, or "0" if it is lower. Thus, "1" or "0" is set to the MSB of the register value of the successive approximation register SAR.

Subsequently, the control circuit 20 outputs the successive approximation data RDA of 11000000 or 01000000 with the second MSB set to be "1." For example, the control circuit 20 outputs the successive approximation data RDA of 11000000 if the comparison result regarding the MSB is "1," or 01000000 if it is "0." Then, the D/A conversion circuit DAC1 outputs the D/A output signal DQ corresponding to the successive approximation data RDA.

Then, the comparison circuit 10 compares the voltage of the signal SADD obtained by adding the code signal SCD to the sampled signal SIN and the voltage of the D/A output signal DQ with each other, and then outputs the comparison result signal CPQ taking a value of "1" or "0." Thus, "1" or "0" is set to the second MSB of the register value of the successive approximation register SAR.

By executing the successive approximation operation described above on the bits from the MSB to the LSB, the determinate successive approximation result data QDA is obtained. In other words, by performing the successive approximation operation so that the voltage of the input signal VIN and the voltage of the D/A output signal DQ become equal to each other, the determinate successive approximation result data QDA is obtained. Then, the data obtained by subtracting the code data CDA from the successive approximation result data QDA thus obtained is output as the data DOUT obtained by performing the A/D conversion on the input signal VIN.

Figure 2:
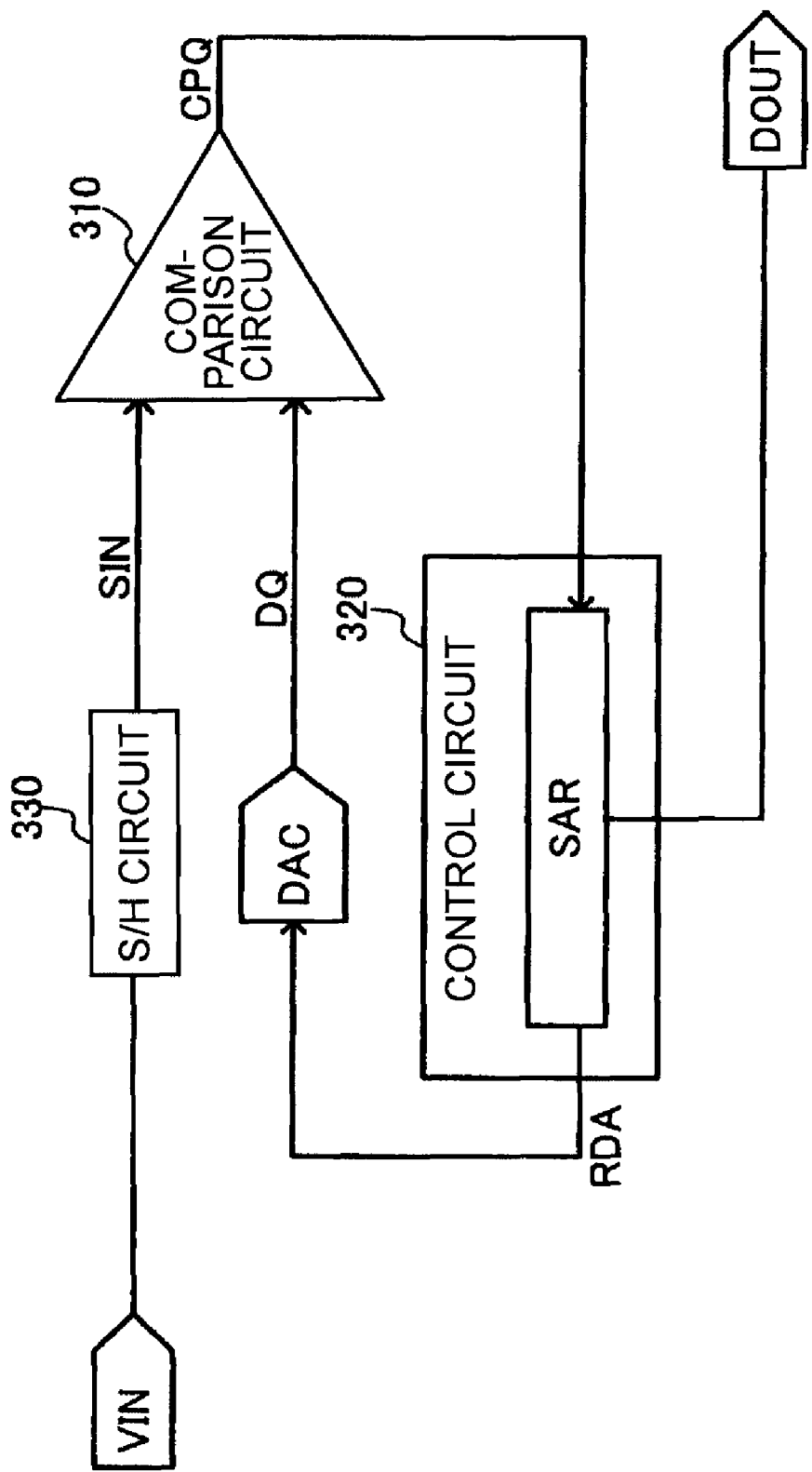
FIG. 2 is a diagram showing a first comparative example of the A/D conversion circuit.
Figure 3:
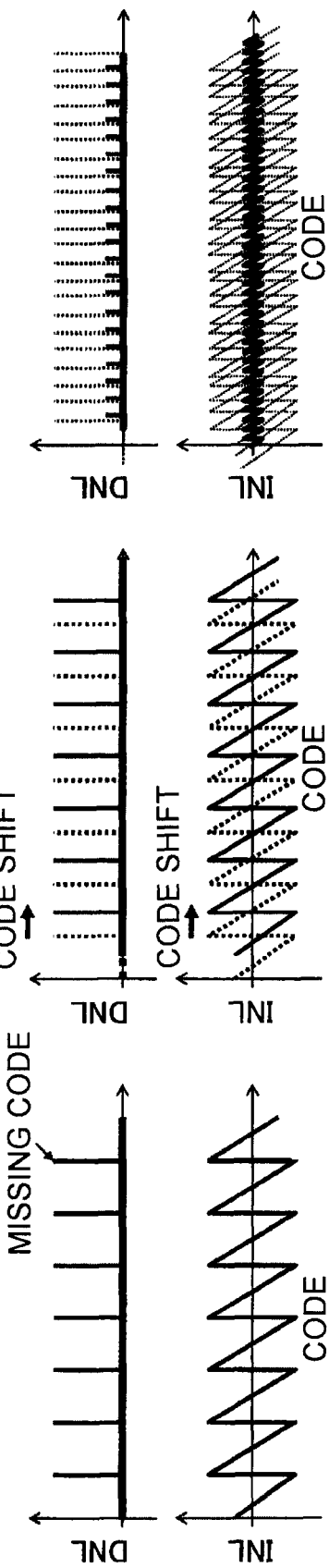
FIGS. 3A through 3C are diagrams for explaining a code shift method in the present embodiment.

FIG. 2 shows an A/D conversion circuit of a first comparative example of the present embodiment. In the first comparative example, the code data generation section 90 and the second D/A conversion circuit DAC2 are not provided. Further, in the first comparative example, as shown in FIG. 3A, a missing code occurs in a specific code due to, for example, an error of DNL. For example, if the DNL exceeds 1 LSB, there is caused the phenomenon of the missing code in which a code with no output code is generated.

In contrast, according to the present embodiment, even if such a missing code occurs, by adding the signal SCD of the time-varying code data CDA to the sampled signal SIN, code shift shown in FIG. 3B is performed. It should be noted that the solid line shown in FIG. 3B represents the characteristic thereof after the code shift, and the broken line represents the characteristic thereof before the code shift.

In other words, in the present embodiment, by setting the value of the code data CDA so as to vary every A/D conversion timing or every plurality of A/D conversion timings, the position of the code at which the missing code occurs varies every A/D conversion timing or every plurality of A/D conversion timings as shown in FIG. 3B. For example, even if the missing code occurs in the code of 00010000, the position thereof is shifted to the positions of 00010001, 00010010, or 00001111. As a result, from a viewpoint of a long period of time, the DNL and the INL are improved as shown in FIG. 3C, and thus there can be obtained a preferable characteristic preventing the phenomenon of the missing code from occurring. In other words, deterioration (the missing code) in the DNL characteristic having occurred in a specific code is diffused to the codes around by the time-varying code data CDA, thereby achieving the improvement of the characteristic.

As described above, according to the present embodiment, by the simple process of generating and then adding the code data CDA, it is achieved to prevent the missing code from occurring, and to improve the characteristics in the DNL and the INL of the A/D conversion circuit.

2. Detailed Configuration Example

Figure 4:
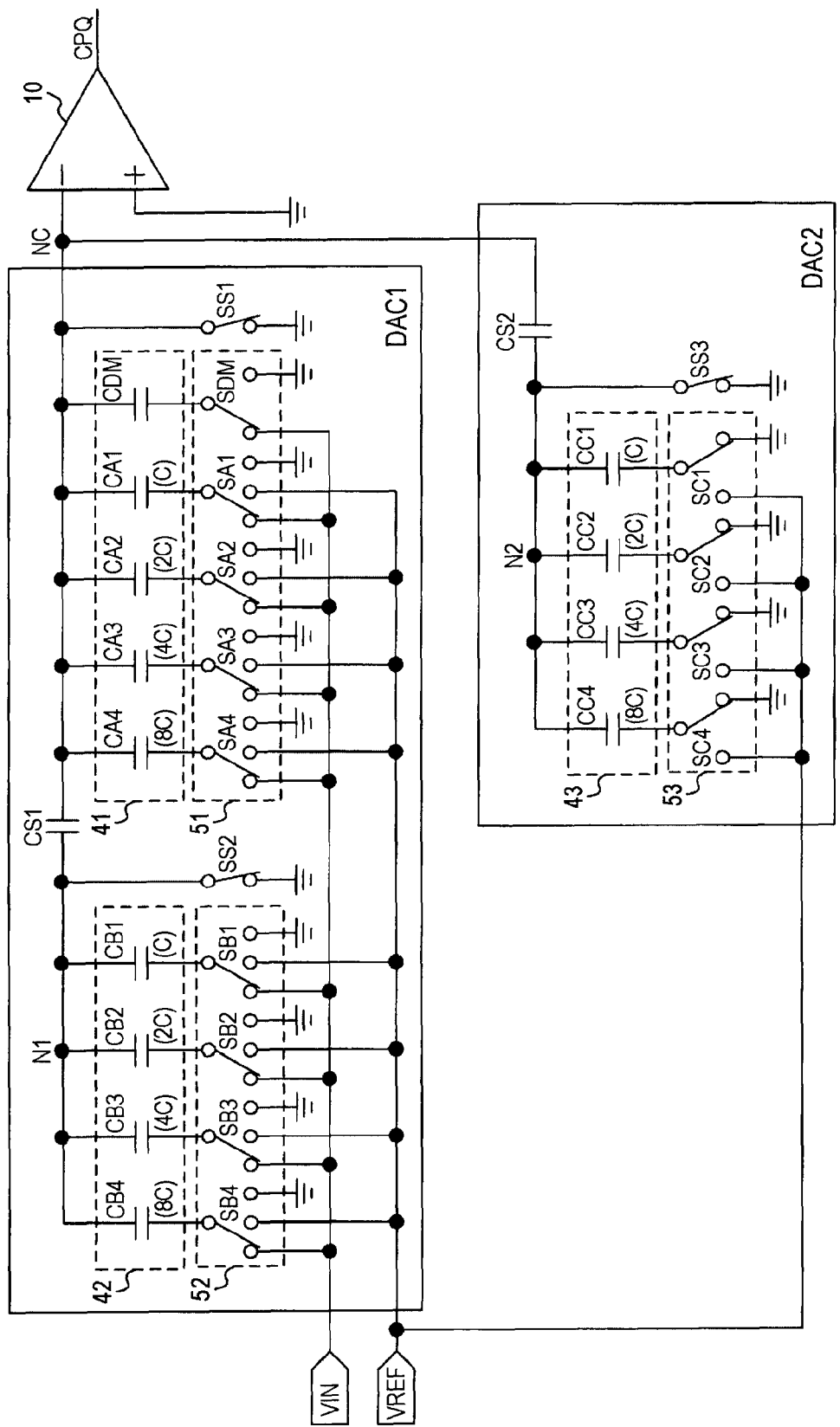
FIG. 4 is a diagram showing a detailed configuration example of the A/D conversion circuit according to the present embodiment.

FIG. 4 shows a detailed configuration example of the A/D conversion circuit according to the present embodiment. FIG. 4 shows a detailed configuration example of the D/A conversion circuits DAC1, DAC2, and the comparison circuit 10 shown in FIG. 1, the D/A conversion circuits DAC1, DAC2 are each formed of a charge redistribution D/A conversion circuit.

Specifically, the first D/A conversion circuit DAC1 includes a first capacitor array section 41 and a first switch array section 51. Further, the first D/A conversion circuit DAC1 includes a first series capacitor CS1 disposed between a comparison node NC and a first node N1. Further, the first D/A conversion circuit DAC1 includes a second capacitor array section 42 and a second switch array section 52. Further, the first D/A conversion circuit DAC1 includes switch elements SS1, SS2 for setting the nodes NC, N1 to be GND (AGND) in the sampling period.

It should be noted that it is also possible to connect one end of a third series capacitor to the node N1, and to provide the other end of the third series capacitor with a capacitor array section and a switch array section having the configurations substantially the same as those of the capacitor array section 42 and the switch array section 52, respectively.

The first capacitor array section 41 of the first D/A conversion circuit DAC1 includes a plurality of capacitors CA1 through CA4. These capacitors CA1 through CA4 have one ends connected to the comparison node NC of the comparison circuit 10. Here, the comparison node NC (a sampling node) is a node to be connected to a first input terminal (an inverting input terminal) of the comparison circuit 10, and a second input terminal (a non-inverting input terminal) of the comparison circuit 10 is set to be the GND. Further, the capacitors CA1 through CA4 are binary weighted, and the capacitance values of the capacitors CA1, CA2, CA3, and CA4 are set to be C, 2C, 4C, and 8C, respectively, in the case of, for example, 4 bits. Further, the first capacitor array section 41 also includes a dummy capacitor CDM.

The first switch array section 51 of the first D/A conversion circuit DAC1 includes a plurality of switch elements SA1 through SA4. These switch elements SA1 through SA4 are connected respectively to the other ends of the capacitors CA1 through CA4 of the first capacitor array section 41. Further, the switch elements SA1 through SA4 are switch-controlled based on the higher bit data (e.g., the higher 4 bit data in the case in which the successive approximation data RDA is 8-bit data) the successive approximation data RDA.

The second capacitor array section 42 of the first D/A conversion circuit DAC1 includes a plurality of capacitors CB1 through CB4. These capacitors CB1 through CB4 have one ends connected to the first node N1. Here, the first node N1 is a node on the other end side of the series capacitor CS1 whose one end is connected to the comparison node NC. Further, the capacitors CB1 through CB4 are binary weighted, and the capacitance values of the capacitors CB1, CB2, CB3, and CB4 are set to be C, 2C, 4C, and 8C, respectively, in the case of, for example, 4 bits.

The second switch array section 52 of the first D/A conversion circuit DAC1 includes a plurality of switch elements SB1 through SB4. These switch elements SB1 through SB4 are connected respectively to the other ends of the capacitors CB1 through CB4 of the second capacitor array section 42. Further, the switch elements SB1 through SB4 are switch-controlled based on the lower bit data (e.g., the lower 4 bit data in the case in which the successive approximation data RDA is 8-bit data) of the successive approximation data RDA.

The second D/A conversion circuit DAC2 includes a second series capacitor CS2 disposed between the comparison node NC and a second node N2. Further, the second D/A conversion circuit DAC2 includes a third capacitor array section 43 and a third switch array section 53. Further, the second D/A conversion circuit DAC2 includes a switch element SS3 for setting the second node N2 to be the GND in the sampling period.

The third capacitor array section 43 of the second D/A conversion circuit DAC2 includes a plurality of capacitors CC1 through CC4. These capacitors CC1 through CC4 have one ends connected to the second node N2. Here, the second node N2 is a node on the other end side of the series capacitor CS2 whose one end is connected to the comparison node N2. Further, the capacitors CC1 through CC4 are binary weighted, and the capacitance values of the capacitors CC1, CC2, CC3, and CC4 are set to be C, 2C, 4C, and 8C, respectively, in the case of, for example, 4 bits.

The third switch array section 53 of the second D/A conversion circuit DAC2 includes a plurality of switch elements SC1 through SC4. These switch elements SC1 through SC4 are connected respectively to the other ends of the capacitors CC1 through CC4 of the third capacitor array section 43. Further, the switch elements SC1 through SC4 are switch-controlled based on the code data CDA.

In other words, the code data generation section 90 outputs the code data CDA to the D/A conversion circuit DAC2, and switching control of the switch elements SC1 through SC4 is performed based on the code data CDA. For example, the code data generation section 90 outputs the data taking a value varying every A/D conversion timing or every plurality of A/D conversion timings within a data range of lower bit data of the successive approximation data RDA as the code data CDA.

Specifically, in the case of the 8-bit A/D conversion shown in FIG. 4, the code data generation section 90 varies the code data CDA within a data range of lower 4 bits of the successive approximation data RDA. For example, the code data generation section 90 varies the code data CDA in a random manner within the data range (or within a data range narrower than the data range of 0000 through 1111) of 0000 through 1111 to perform switching control of the switch elements SC1 through SC4 of the switch array section 53 of the D/A conversion circuit DAC2. In this case, the switching control of the switch elements SB1 through SB4 of the switch array section 52 of the D/A conversion circuit DAC1 is also performed in accordance with the lower 4-bit data of the successive approximation data RDA. As described above, by setting the range in which the code data CDA is varied within the data range of the successive approximation data RDA for performing the switching control of the switch elements of the first D/A conversion circuit DAC1, the missing code can effectively be prevented from occurring.

It should be noted that the minimum resolution (a voltage corresponding to the LSB, or a quantized voltage) of the first D/A conversion circuit DAC1 is denoted as RS1, and the minimum resolution of the second D/A conversion circuit DAC2 is denoted as RS2. In this case, RS2=RS1 is satisfied in FIG. 4. Specifically, the capacitance values of the series capacitors CS1, CS2 are arranged to be the same (substantially the same), and the capacitance value of the capacitor CB1 corresponding to the LSB of the first D/A conversion circuit DAC1 and the capacitance value of the capacitor CC1 corresponding to the LSB of the second D/A conversion circuit DAC2 are also arranged to be the same (substantially the same). In other words, the second D/A conversion circuit DAC2 outputs a code voltage higher than a noise voltage instead of the noise voltage lower than the minimum resolution RS1 (the LSB) of the first D/A conversion circuit DAC1. According to such a configuration, the code shift shown in FIG. 3B can be realized. It should be noted that RS2=RS1 is not a limitation, but RS2≧RS1 can be adopted.

Figure 5:
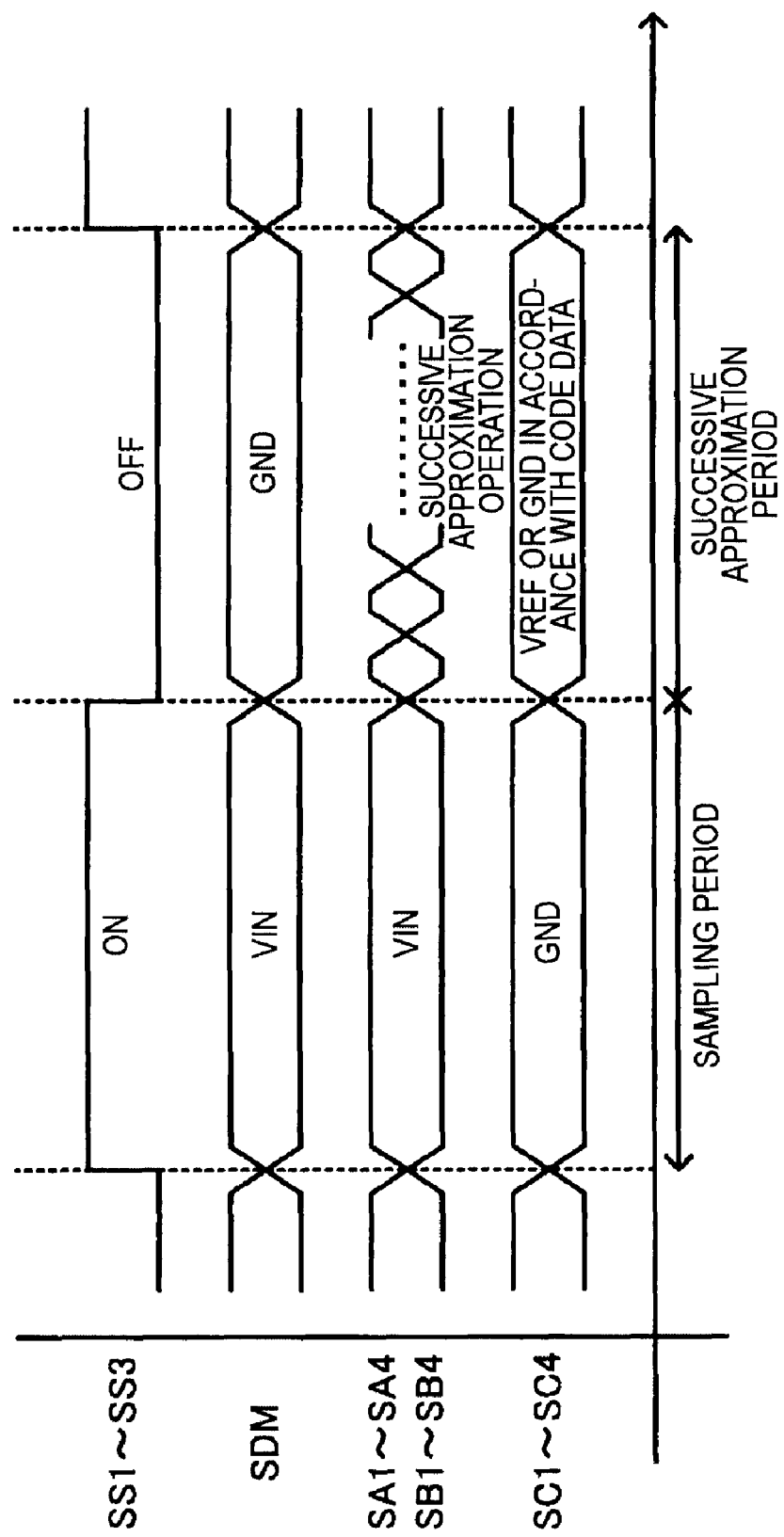
FIG. 5 is a diagram for explaining an operation of the A/D conversion circuit.

Then, the operation of the present embodiment will be explained in detail with reference to FIG. 5. As shown in FIG. 5, in the sampling period of the input signal VIN, the switch elements SS1, SS2 of the primary D/A conversion circuit DAC1 are switched on to thereby set the nodes NC, N1 to be the GND. Further, the other ends of the capacitors CA1 through CA4, and CB1 through CB4 are set to be the voltage level of the input signal VIN via the respective switch elements SA1 through SA4, and SB1 through SB4 of the first D/A conversion circuit DAC1.

Thus, sampling of the input signal VIN is achieved. Then, when the switch elements SA1 through SA4, and SB1 through SB4 are switched off, the voltage of the input signal VIN is held at that timing. It should be noted that in the sampling period, the other end of the dummy capacitor CDM is set to be the voltage level of the input signal VIN via the switch element SDM for the dummy capacitor CDM.

Further, in the sampling period, the switch element SS3 of the second D/A conversion circuit DAC2 for the code shift is switched on to thereby set the node N2 to be the GND. Further, the other ends of the capacitors CC1 through CC4 are set to be the GND via the switch elements SC1 through SC4. Thus, the both ends of the capacitors CC1 through CC4 are set to be the GND to thereby be set to the state in which no charge is stored.

Subsequently, when the successive approximation period for the A/D conversion takes place, the switch elements SS1, SS2 of the primary D/A conversion circuit DAC1 are switched off. Further, the other end of the switch element SDM for the dummy capacitor CDM is set to be the GND.

Then, the switching control of the switch elements SA1 through SA4, and SB1 through SB4 of the first D/A conversion circuit DAC1 is performed based on the respective bits of the successive approximation data RDA, and the other ends of the capacitors CA1 through CA4, and CB1 through CB4 are set to be the VREF or the GND.

For example, if the successive approximation data RDA is equal to 10000000, the other end of the capacitor CA4 corresponding to the MSB of the successive approximation data RDA is set to be the reference voltage VREF. Further, the other ends of the other capacitors CA3 through CA1, and CB4 through CB1 are set to be the GND.

Further, if the successive approximation data RDA is equal to 10001000, the other ends of the capacitors CA4 and CB4 are set to be the reference voltage VREF. Further, the other ends of the other capacitors CA3 through CA1, and CB3 through CB1 are set to be the GND.

Subsequently, when the successive approximation period for the A/D conversion takes place, the switch element SS3 of the second D/A conversion circuit DAC2 for the code shift is switched off. Then, the switching control of the switch elements SC1 through SC4 of the second D/A conversion circuit DAC2 is performed based on the respective bits of the code data CDA, and the other ends of the capacitors CC1 through CC4 are set to be the reference voltage VREF or the GND.

In the case in which the code data CDA is equal to, for example, 1000, the other end of the capacitor CC4 is set to be the reference voltage VREF, and the other ends of the other capacitors CC3 through CC1 are set to be the GND. Further, in the case in which the code data CDA is equal to, for example, 1100, the other ends of the capacitors CC4 and CC3 are set to be the reference voltage VREF, and the other ends of the other capacitors CC2 and CC1 are set to be the GND.

In this case, the code data CDA varies every A/D conversion timing shown in FIG. 5. Specifically, the code data varies every A/D conversion period composed of the sampling period and the successive approximation period. It should be noted that it is also possible to vary the code data CDA every plurality of A/D conversion timings.

In the charge redistribution A/D conversion circuit shown in FIG. 4, there is performed a comparison process between the sampled signal (the sampled voltage) of the input signal VIN, and the addition signal (an addition voltage) of the D/A output signal and the code signal (a code voltage). In this case, the control circuit 20 performs a process of adding the code data CDA to the successive approximation result data QDA of the successive approximation register SAR.

Specifically, in the sampling period, the charge corresponding to the input signal VIN is stored in the capacitors CA1 through CA4, and CB1 through CB4. Further, the charge stored in accordance with the input signal VIN and the charge stored in the capacitors CA1 through CA4, CB1 through CB4, and CC1 through CC4 in accordance with the successive approximation data RDA and the code data CDA in the successive approximation period are compared to each other. Then, the successive approximation data RDA with which both of the charges are the same is output from the successive approximation register SAR as the successive approximation result data QDA. Then, the data obtained by adding the code data CDA to the successive approximation result data QDA is output as the data DOUT obtained by performing the A/D conversion on the input signal VIN. According to the process described above, it becomes possible to output appropriate A/D conversion data while realizing the code shift with the code data CDA shown in FIG. 3B.

Figure 6:
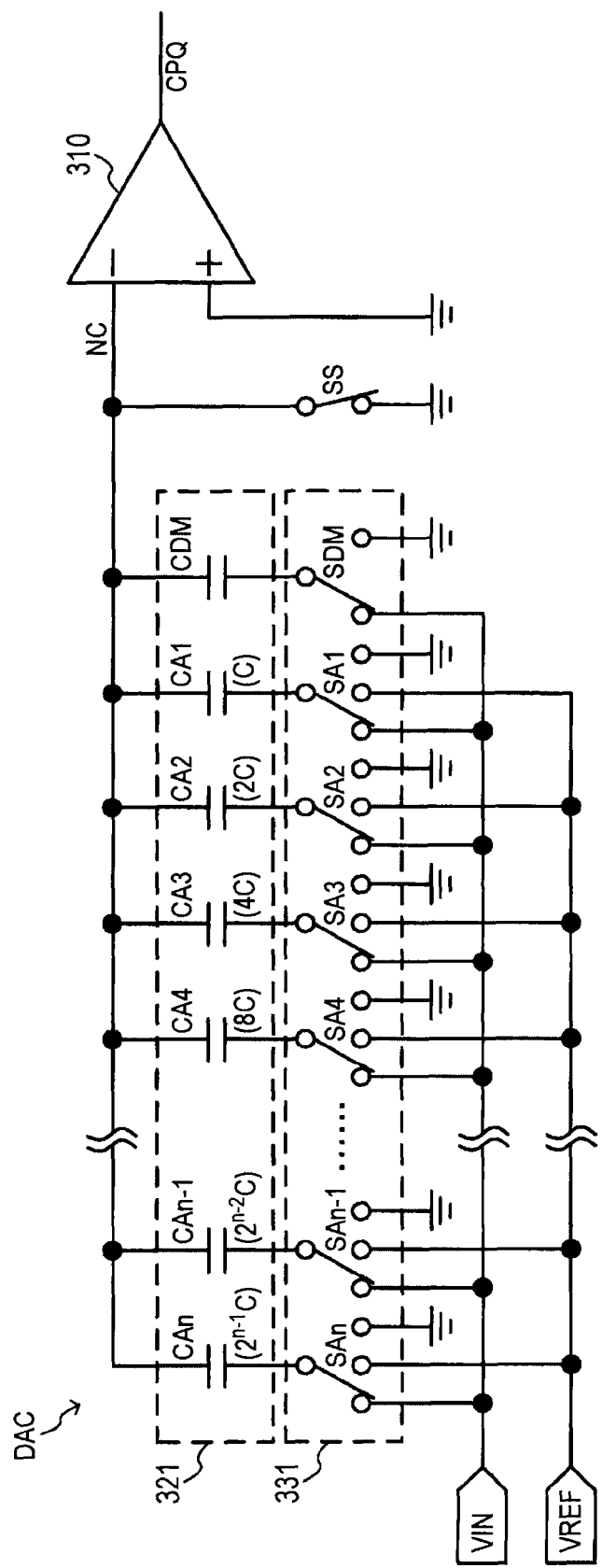
FIG. 6 is a diagram showing a second comparative example of the A/D conversion circuit.

FIG. 6 shows an A/D conversion circuit of a second comparative example of the present embodiment. This second comparative example is an example of realizing the first comparative example shown in FIG. 2 using the charge redistribution circuit, and the D/A conversion circuit DAC (and the S/H circuit 330) is realized by a capacitor array section 321, a switch array section 331, and a switch element SS.

A significant factor for determining the conversion accuracy of the A/D conversion circuit is the conversion accuracy of the D/A conversion circuit DAC. In the second comparative example shown in FIG. 6, assuming that the resolution of the DAC is n bits, the capacitor array section 321 is composed of n capacitors CA1 through CAn binary weighted and one dummy capacitor CDM. Further, in the sampling period, the other ends of the capacitors CA1 through CAn are connected to the input signal VIN, and the comparison node NC is set to be the GND.

Then, in the successive approximation period, the successive approximation process is performed sequentially from the MSB, the most significant bit. Specifically, connection destinations of the other ends of the capacitors CA1 through CAn are switched between the reference voltage VREF and the GND in accordance with the input value of the D/A conversion circuit using the switch elements SA1 through SAn of the switch array section 331. Thus, the voltage of the comparison node NC of the inverting input terminal of the comparison circuit 310 becomes the voltage obtained by subtracting the sampled voltage of the input signal VIN from the output value of the D/A conversion circuit DAC.

However, in the second comparative example shown in FIG. 6, if the resolution of the D/A conversion circuit DAC is set to be 12 bits in order for setting the resolution of the A/D conversion circuit to be, for example, 12 bits, the total capacitance value of $2^{12} \times C$ is required. Therefore, the size of the circuit is enlarged, and at the same time, a large current is required for charging the capacitors. Since the higher the resolution of the A/D conversion circuit is set, the stronger the tendency becomes, the second comparative example shown in FIG. 6 has a problem that there is a limitation of increasing the number of bits.

Figure 7:
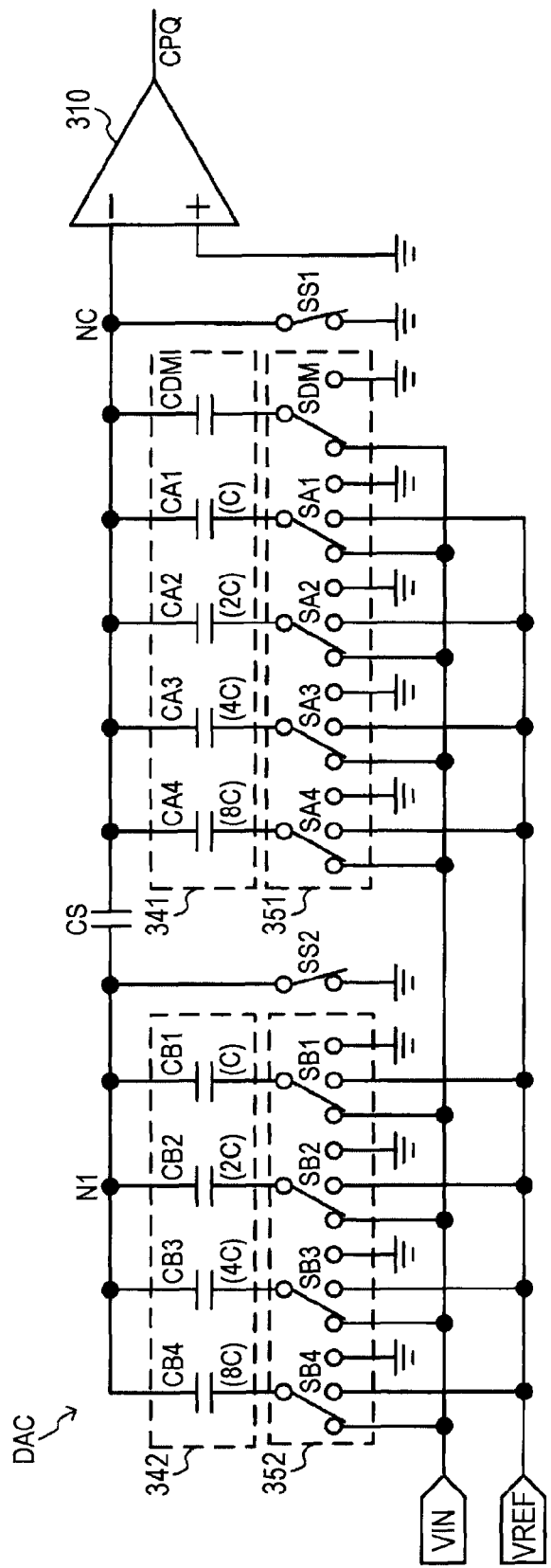
FIG. 7 is a diagram showing a third comparative example of the A/D conversion circuit.

FIG. 7 shows a third comparative example of the A/D conversion circuit. In order for solving the problem of the second comparative example described above, the third comparative example has a configuration of providing the series capacitor CS to thereby provide multiple stages of binary weighted capacitors. Specifically, there is provided a series capacitor CS having one end connected to the comparison node NC and the other end connected to the node N1. Further, there are provided a capacitor array section 341 connected to the comparison node NC, a switch array section 351 for performing the switching control of the capacitor array section 341, a capacitor array section 342 connected to the node N1, and a switch array section 352 for performing the switching control of the capacitor array section 342.

According to the configuration of the third comparative example shown in FIG. 7, it is possible to make, for example, the capacitance value of the capacitor CA1 of the capacitor array section 341 and the capacitance value of the capacitor CB1 of the capacitor array section 342 equal to each other. Therefore, taking the 8-bit case as an example, the capacitance value of $2^5 \times C$ is enough for the third comparative example shown in FIG. 7 while the capacitance value of $2^8 \times C$ is required for the second comparative example shown in FIG. 6. Therefore, reduction in the area of the circuit can be achieved, and at the same time, the charge current of the capacitors can also be reduced.

However, in the third comparative example shown in FIG. 7, there arises a problem that the capacitance parasitic on the node N1 deteriorates the differential non-linearity (DNL) or the integral non-linearity (INL) of the D/A conversion circuit DAC. This is caused by the fact that the ratio between the binary weighted capacitances is deviated by the parasitic capacitance. This negative influence remarkably arises in the vicinity of the code with the fifth LSB changed when taking the 8-bit case shown in FIG. 7 as an example. Specifically, it arises at the transition between 00001111 and 00010000 (the MSB is at the forefront), and causes the problem of the missing code as shown in FIG. 3A.

As a method of solving such a problem, it is possible to adopt a method of trimming the capacitance value of the series capacitor CS to fine-tune the characteristic. However, if the trimming is used alone, there exist limitations in the unit and the range of the capacitance which can be trimmed. Further, the trimming process is required in the manufacturing process, which incurs increase in cost. Further, although it is also possible to perform a digital compensation process for correcting the A/D-converted data in a digital manner to thereby achieve higher accuracy, there arises a problem that the process becomes complicated, and at the same time, an extra process is required.

Then, a logical expression of the SAR type A/D conversion circuit in the case in which the parasitic capacitances CP1, CP2 are added to the nodes NC, N1 will be explained with reference to FIG. 8. The logical expression not including the parasitic capacitances CP1, CP2 can be derived by setting the parasitic capacitances CP1, CP2 to be zero. It should be noted that the capacitance values of the capacitors CA1, CB1 are assumed to be C, the capacitance values of the capacitors CA2, CB2 are assumed to be 2C, the capacitance values of the capacitors CA3, CB3 are assumed to be 4C, and the capacitance values of the capacitors CA4, CB4 are assumed to be 8C. Further, the capacitance value of the series capacitor CS is assumed to be C. Further, the dummy capacitor CDM is used for the purpose (full-scale adjustment) of adjusting the amount of charge charged when sampling, and the capacitance value of the dummy capacitor CDM is ignored for the sake of simplification of explanation.

Figure 8:
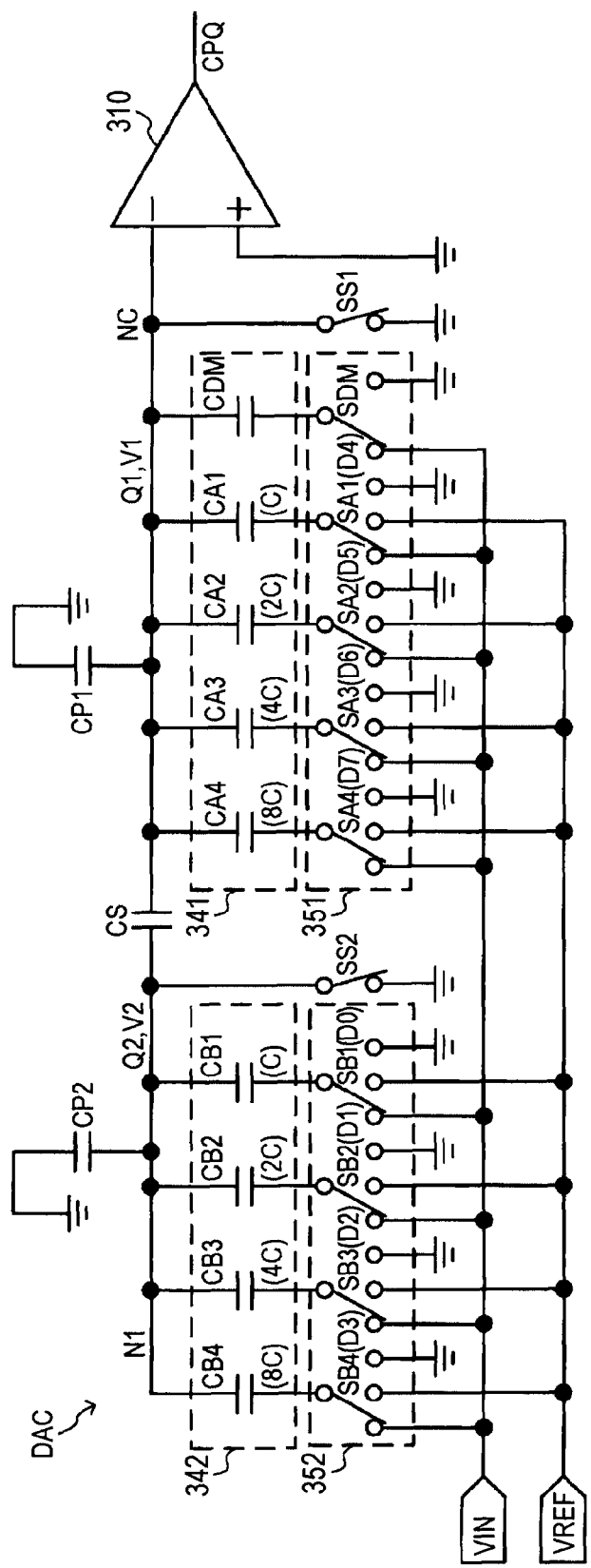
FIG. 8 is an explanatory diagram regarding a negative influence exerted by a parasitic capacitance.

FIG. 8 shows a state of the switch element in the sampling period. The charge amount Q1 charged in the node NC in the sampling period is expressed by the following formula (1).

$$Q1 = (C + 2C + 4C + 8C)(0 - VIN) \quad (1)$$
$$= -15C \cdot VIN$$

Further, the charge amount Q2 charged in the node N1 in the sampling period is expressed by the following formula (2).

$$Q2 = (C + 2C + 4C + 8C)(0 - VIN) \quad (2)$$
$$= -15C \cdot VIN$$

It should be noted that since the both ends of the series capacitor CS and the parasitic capacitances CP1, CP2 are provided with GND (the ground potential), no charge is charged thereto.

Subsequently, the voltage V1 of the node NC and the voltage V2 of the node N1 in the successive approximation period are obtained. For example, in FIG. 8, the switching control of the switch elements SB1 through SB4 is performed in accordance with the lower 4 bits D0 through D3 of the successive approximation data RDA, and the switching control of the switch elements SA1 through SA4 is performed in accordance with the higher 4 bits D4 through D7 of the successive approximation data RDA. Specifically, if the bit Di is equal to 1 ($0 \leq i \leq 7$), the corresponding switch element is connected to the input signal VIN, and if the bit Di is equal to 0, the corresponding switch element is connected to the GND. In this case, the charge amounts Q1, Q2 to be accumulated in the nodes NC, N1 during the successive approximation period are expressed respectively as the following formulas (3), (4).

$$Q1 = CP1(V1-0) + CS(V1-V2) + C(V1-VREF \cdot D0) + 2C(V1-VREF \cdot D1) + 4C(V1-VREF \cdot D2) + 8C(V1-VREF \cdot D3) \quad (3)$$

$$Q2 = CP2(V2-0) + CS(V2-V1) + C(V2-VREF \cdot D4) + 2C(V2-VREF \cdot D5) + 4C(V2-VREF \cdot D6) + 8C(V2-VREF \cdot D7) \quad (4)$$

Further, according to the law of conservation of charge, the charge amount Q1 in the formulas (1) and (3) is the same, and the charge amount Q2 in the formulas (2) and (4) is the same. Further, since the voltage of the node NC of the inverting input terminal of the comparison circuit 310 becomes equal to the GND of the non-inverting input terminal after the comparison operation with respect to all of the bits D0 through D7 of the successive approximation data RDA has been completed, the following formula (5) becomes true.

$$V1 = 0 \quad (5)$$

Therefore, by solving the simultaneous formulas (1) through (5) with respect to the input signal VIN, the following formula (6) is derived.

$$VIN = \frac{VREF}{255C + 15CP2}[(D0 + 2D1 + 4D2 + 8D3 + 16D4 + 32D5 + 64D6 + 128D7)C + (D4 + 2D5 + 4D6 + 8D7)CP2] \quad (6)$$

As is obvious from the formula (6), no influence of the parasitic capacitance CP1 of the node NC is exerted on the A/D conversion result of the input signal VIN, and only the parasitic capacitance CP2 of the node N2 exerts a negative influence on the characteristic. Therefore, in order for reducing the negative influence of the parasitic capacitance CP2, the series capacitor CS needs to be trimmed. Further, according to the formula (6), it is understood that the negative influence of the parasitic capacitance CP2 appears when the connection of the switch element corresponding to any one of the bits D4 or higher is changed, and thus the missing code shown in FIG. 3A occurs.

Figure 9A:
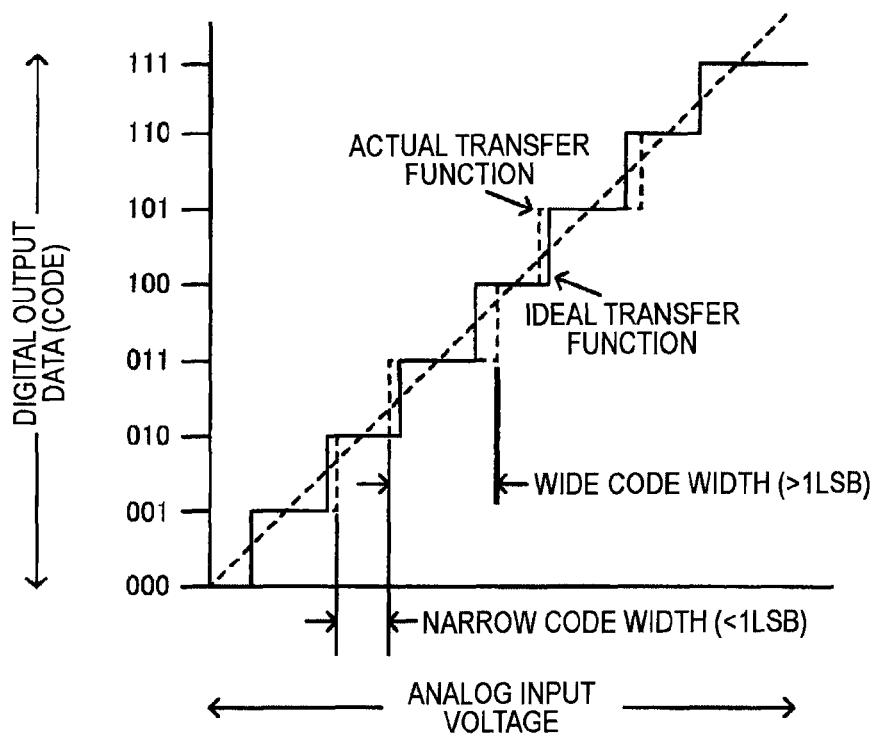
FIGS. 9A and 9B are explanatory diagrams of DNL and INL, respectively.
Figure 9B:
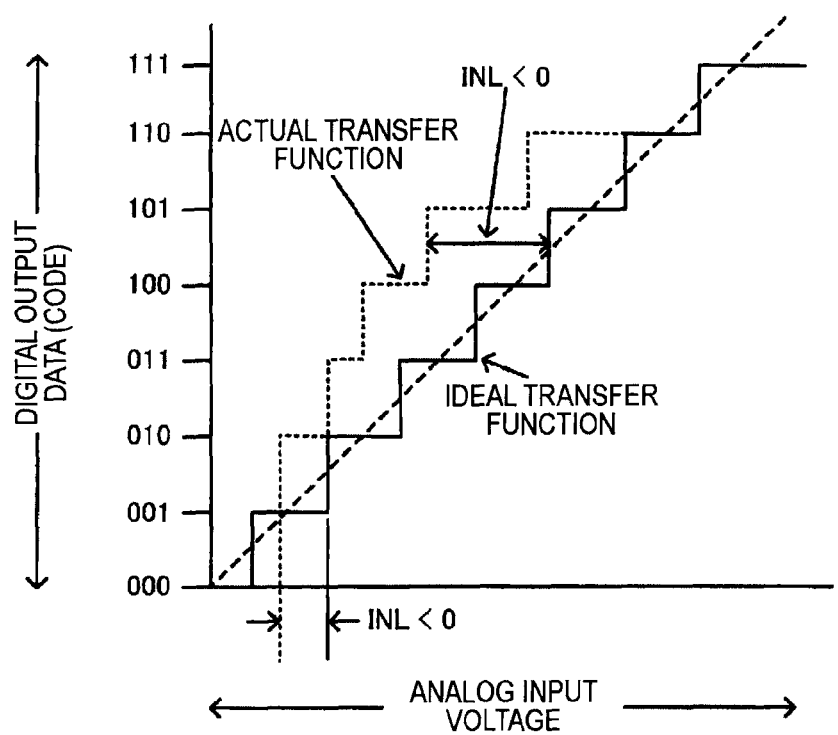

It should be noted that FIGS. 9A and 9B are explanatory diagrams of DNL and INL, respectively. The DNL shown in FIG. 9A corresponds to a difference between the ideal code width and the measured code width. For example, in FIG. 9A, due to the deterioration of the characteristic of the DNL, the width of the code 010 is narrowed, while the width of the code 011 is widened. Further, if the width of the code 010 is further narrowed to disappear, the code 010 turns to the missing code shown in FIG. 3A.

Further, the INL shown in FIG. 9B corresponds to the maximum difference between the actual code transition point (the broken line) and the ideal transition point (the solid line) corresponding thereto after the gain error and the offset error have been removed. The INL taking a positive value shows that the transition is delayed from the ideal point while the INL taking a negative value shows that the transition is earlier than the ideal point.

Figure 10A:
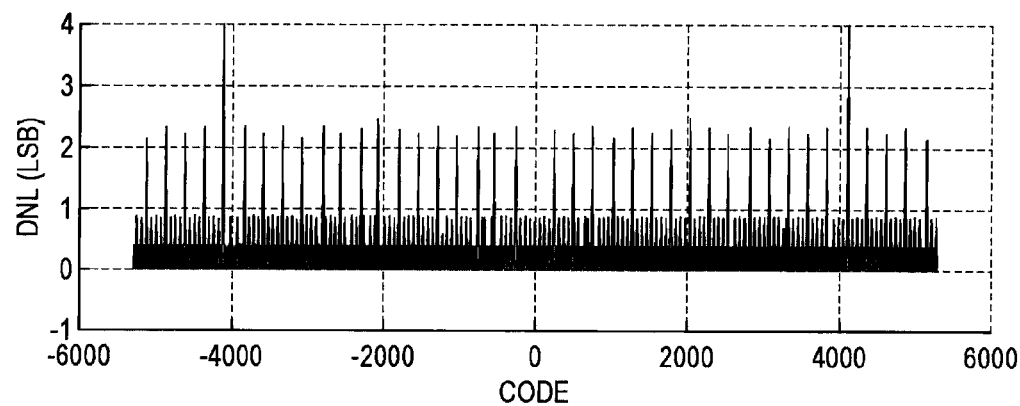
FIGS. 10A and 10B are diagrams showing a simulation result of DNL.
Figure 10B:
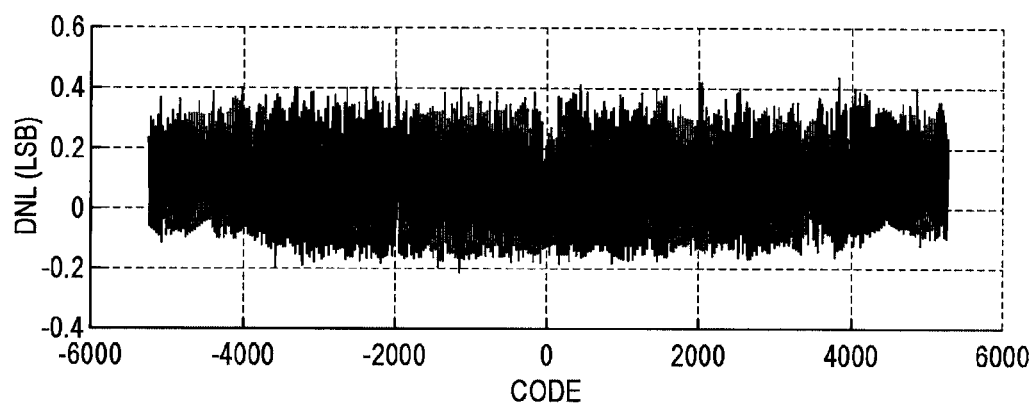

FIGS. 10A and 10B show examples of a simulation result of the DNL. Here, the explanation will be presented taking the case as an example, in which the full-differential A/D conversion circuit described later is used, a 14-bit D/A conversion circuit is used as the primary D/A conversion circuit DAC1, and a 4-bit D/A conversion circuit is used as the D/A conversion circuit DAC2 for the code shift. Although in FIG. 4 the primary D/A conversion circuit DAC1 has a two-stage serial configuration of 4-bit D/A conversion circuits, the 14-bit primary D/A conversion circuit DAC1 has a three-stage configuration of a 6-bit D/A conversion circuit and two 4-bit D/A conversion circuits.

FIG. 10A shows an example of the simulation result of the DNL in the case in which the code shift method of the present embodiment is not adopted. In FIG. 10A, the missing code in which the DNL becomes 1 LSB or more occurs.

FIG. 10B shows an example of the simulation result of the DNL in the case in which the code shift method of the present embodiment is adopted. In FIG. 10B, the DNL is kept lower than 1 LSB, thus the missing code is prevented from occurring.

As described above, according to the present embodiment, as shown in FIG. 4, the D/A conversion circuit DAC2 for the code shift is added to the third comparative example shown in FIG. 7 to add the signal of the code data by the D/A conversion circuit DAC2, thereby realizing the code shift.

Specifically, in the third comparative example shown in FIG. 7, due to the parasitic capacitance CP2 of the node N1, the missing code shown in FIG. 3A and FIG. 10A is caused. In contrast thereto, according to the present embodiment, the signal of the time-varying code data is added by the D/A conversion circuit DAC2, thereby deterioration (the missing code) of the DNL having occurred in the specific code is temporally diffused to the codes around. For example, in the case in which the missing code occurs at the fourth MSB, namely 00010000, the signal of the random code data varying within the data range of 0000 through 1111 is added. According to the process described above, the DNL can be kept lower than 1 LSB as shown in FIG. 3B and FIG. 10B, thereby preventing the missing code from occurring. Therefore, also in the case in which the series capacitor CS1 is provided for reducing the circuit size, the missing code caused by the parasitic capacitance of the node N1 can be prevented from occurring. As a result, it becomes possible to achieve both of reduction in the circuit size and prevention of deterioration of the characteristic of the A/D conversion.

3. Full-Differential A/D Conversion Circuit

Figure 11:
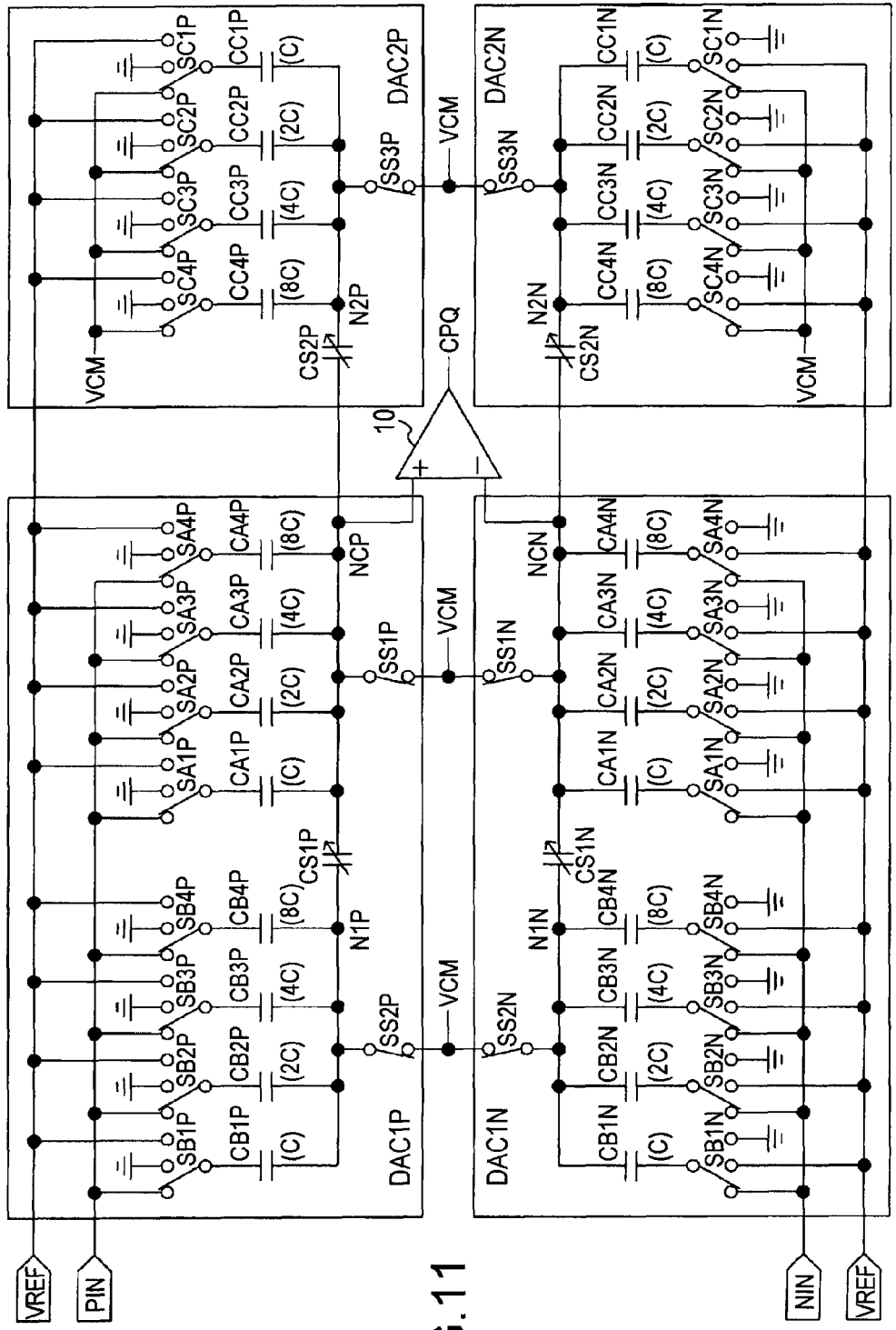
FIG. 11 is a diagram showing a configuration example of a full-differential A/D conversion circuit according to the present embodiment.

FIG. 11 shows a configuration example of the full-differential A/D conversion circuit to which the code shift method according to the present embodiment is applied. The A/D conversion circuit shown in FIG. 11 includes the comparison circuit 10, a primary D/A conversion circuit DAC1P connected to a non-inverting input terminal of the comparison circuit 10, and a primary D/A conversion circuit DAC1N connected to an inverting input terminal thereof. Further, the A/D conversion circuit includes a D/A conversion circuit DAC2P for the code shift connected to the non-inverting input terminal of the comparison circuit 10 and a D/A conversion circuit DAC2N for the code shift connected to the inverting input terminal thereof.

The configuration of each of the primary D/A conversion circuit DAC1P on the non-inverting side (the positive side) and the primary D/A conversion circuit DAC1N on the inverting side (the negative side) includes the capacitor array section and the switch array section similarly to the primary D/A conversion circuit DAC1 shown in FIG. 4. Further, the D/A conversion circuit DAC1P is provided with an input signal PIN on the non-inverting side (the positive side) constituting a differential signal input thereto, and the D/A conversion circuit DAC1N is provided with an input signal NIN on the inverting side (the negative side) constituting the differential signal input thereto.

Further, in the sampling period nodes NCP, N1P of the D/A conversion circuit DAC1P are set to be a common voltage (an intermediate voltage) VCM by respective switch elements SS1P, SS2P. Further, nodes NCN, N1N of the D/A conversion circuit DAC1N are set to be the common voltage VCM by respective switch elements SS1N, SS2N.

Further, in the sampling period one ends of switch elements SA1P through SA4P and SB1P through SB4P of the D/A conversion circuit DAC1P are connected to the signal PIN on the non-inverting side of the differential signal, and one ends of switch elements SA1N through SA4N and SB1N through SB4N of the D/A conversion circuit DAC1N are connected to the signal NIN on the inverting side of the differential signal.

On the other hand, in the successive approximation period the one ends of the switch elements SA1P through SA4P and SB1P through SB4P of the D/A conversion circuit DAC1P are connected to the VREF if the corresponding bit of the successive approximation data is set to be "1," or connected to the GND if it is set to be "0."

In contrast thereto, the one ends of the switch elements SA1N through SA4N and SB1N through SB4N of the D/A conversion circuit DAC1N are connected to the GND if the corresponding bit of the successive approximation data is set to be "1," or connected to the VREF if it is set to be "0."

The D/A conversion circuit DAC2P for the code shift on the non-inverting side and the D/A conversion circuit DAC2N for the code shift on the inverting side each include the capacitor array section and the switch array section similarly to the D/A conversion circuit DAC2 for the code shift shown in FIG. 4.

Further, in the sampling period a node N2P of the D/A conversion circuit DAC2P is set to be the VCM by a switch element SS3P. Further, a node N2N of the D/A conversion circuit DAC2N is set to be the VCM by a switch element SS3N. Further, one ends of switch elements SC1P through SC4P of the D/A conversion circuit DAC2P and switch elements SC1N through SC4N of the D/A conversion circuit DAC2N are connected to the VCM.

On the other hand, in the successive approximation period the one ends of the switch elements SC1P through SC4P of the D/A conversion circuit DAC2P are connected to the VREF if the corresponding bit of the code data is set to be "1," or connected to the GND if it is set to be "0." In contrast thereto, the one ends of the switch elements SC1N through SC4N of the D/A conversion circuit DAC2N are connected to the GND if the corresponding bit of the code data is set to be "1," or connected to the VREF if it is set to be "0."

According also to the configuration shown in FIG. 11, it is also possible to improve the DNL and the INL of the A/D conversion circuit using the code shift method, thereby preventing the missing code and so on from occurring. Further, by configuring the A/D conversion circuit as the full-differential A/D conversion circuit, the amplitude can be increased, the S/N ratio can be improved, and at the same time, an influence of the common mode noise can be reduced.

4. Electronic Apparatus

Figure 12:
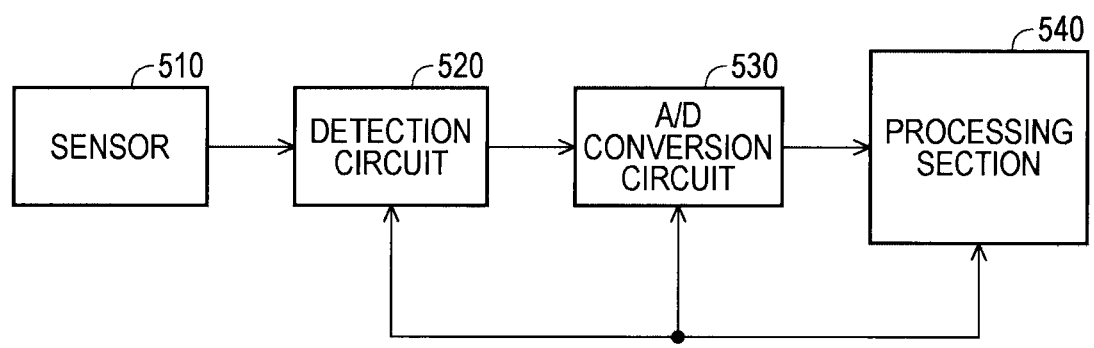
FIG. 12 is a configuration example of an electronic apparatus of the present embodiment.

FIG. 12 shows a configuration example of an electronic apparatus including the A/D conversion circuit according to the present embodiment. The electronic apparatus includes a sensor 510, a detection circuit 520, an A/D conversion circuit 530, and a processing section 540. It should be noted that various modified implementations such as elimination of some constituents or addition of other constituents are also possible. For example, the detection circuit 520, the A/D conversion circuit 530, and the processing section 540 can be realized by an integrated circuit device.

As the electronic apparatus shown in FIG. 12, various apparatuses such as a bioinstrumentation apparatus (e.g., a pulse meter and a pedometer), a personal digital assistance, a video apparatus (a digital camera, a video camera), or a timepiece can be assumed.

The sensor 510 corresponds to a gyro sensor, an acceleration sensor, a photo sensor, or a pressure sensor, and various sensors corresponding to the purpose of the electronic apparatus can be used. The detection circuit 520 amplifies the sensor signal output from the sensor 510 to extract a desired signal. Further, the A/D conversion circuit 530 converts the detection signal (the desired signal) from the detection circuit 520 into digital data, and outputs it to the processing section 540.

The processing section 540 executes a necessary digital signal processing on the digital data from the A/D conversion circuit 530. Further, the processing section 540 can also perform gain control of the detection circuit 520. Here, as the digital signal processing performed by the processing section 540, various kinds of processing such as a fast Fourier transformation for extracting appropriate desired signal from the sensor signal can be assumed.

It should be noted that although the present embodiment is hereinabove explained in detail, it should easily be understood by those skilled in the art that various modifications not substantially departing from the novel matters and the effects of the invention are possible. Therefore, such modified examples should be included in the scope of the invention. For example, a term described at least once with a different term with a broader sense or the same meaning in the specification or the accompanying drawings can be replaced with the different term in any part of the specification or the accompanying drawings. Further, all of the combinations of the present embodiment and the modified examples can also be included in the scope of the invention. Further, the configurations and the operations, the A/D conversion method, the code generation method, and the code shift method of the A/D conversion circuit and the electronic apparatus are not limited to those explained in the present embodiment, and various modified implementations thereof are also possible. For example, although an example of the case of the primary D/A conversion circuit DAC1 having the two-stage configuration is shown in FIG. 4, a configuration of three or more stages can also be adopted.

The entire disclosure of Japanese Patent Application No. 2009-112511, filed May 7, 2009 is expressly incorporated by reference herein.

What is claimed is:

1. An A/D conversion circuit in which an input signal as analog data is converted to an A/D conversion data as digital data, comprising:
a sample-and-hold circuit adapted to sample and hold the input signal to output a sampled signal;
a control circuit adapted to output successive approximation data;
a first D/A conversion circuit adapted to perform D/A conversion on the successive approximation data to output a first D/A output signal;
a second D/A conversion circuit adapted to perform D/A conversion on time-varying code data to output a second D/A output signal; and
a comparison circuit adapted to compare the first D/A output signal with an addition signal that is provided as a sum of the sampled signal and the second D/A output signal, and to output a comparison result signal,
wherein the control circuit has a successive approximation register in which register values are set in accordance with the comparison result signal, provides successive approximation result data after all of the register values of the successive approximation register have been determined, subtracts the time-varying code data from the successive approximation result data, and outputs the A/D conversion data that is provided by subtracting the time-varying code data from the successive approximation result data.

2. An A/D conversion circuit in which an input signal as analog data is converted to an A/D conversion data as digital data, comprising:
a sample-and-hold circuit adapted to sample and hold the input signal to output a sampled signal;
a control circuit adapted to output successive approximation data;
a first D/A conversion circuit adapted to perform D/A conversion on the successive approximation data to output a first D/A output signal;
a second D/A conversion circuit adapted to perform D/A conversion on time-varying code data to output a second D/A output signal; and
a comparison circuit adapted to compare the sampled signal with an addition signal that is provided as a sum of the first D/A output signal and the second D/A output signal, and to output a comparison result signal,
wherein the control circuit has a successive approximation register in which register values are set in accordance with the comparison result signal, provides successive approximation result data after all of the register values of the successive approximation register have been determined, adds the time-varying code data to the successive approximation result data, and outputs the A/D conversion data that is provided by adding the time-varying code data to the successive approximation result data.

3. The A/D conversion circuit according to claim 1, wherein
denoting a minimum resolution of the first D/A conversion circuit as RS1, and a minimum resolution of the second D/A conversion circuit as RS2, $RS2 \geq RS1$ is satisfied.

4. The A/D conversion circuit according to claim 1, further comprising:
a time-varying code data generation section adapted to generate the time-varying code data,
wherein the time-varying code data generation section outputs
a value varying every A/D conversion timing or every plurality of A/D conversion timings within a predetermined data range as the time-varying code data.

5. The A/D conversion circuit according to claim 1, wherein
the first D/A conversion circuit and the second A/D conversion circuit are each a charge redistribution D/A conversion circuit.

6. The A/D conversion circuit according to claim 5, wherein
the first D/A conversion circuit includes
a first capacitor array section having a plurality of first capacitors in which one end of the plurality of first capacitors is connected to a comparison node of the comparison circuit,
a first switch array section having a plurality of switch elements, which is connected to the other end of the plurality of first capacitors of the first capacitor array section, and on which switching control is performed based on higher-bit data of the successive approximation data, a first series capacitor disposed between the comparison node and a first node, a second capacitor array section having a plurality of second capacitors in which one end of the plurality of second capacitors is connected to the first node, and a second switch array section having a plurality of switch elements, which is connected to the other end of the plurality of second capacitors of the second capacitor array section, and on which switching control is performed based on lower-bit data of the successive approximation data, and the second D/A conversion circuit includes a second series capacitor disposed between the comparison node and a second node, a third capacitor array section having a plurality of third capacitors in which one end of the plurality of third capacitors is connected to the second node, and a third switch array section having a plurality of switch elements, which is connected to the other end of the plurality of third capacitors of the third capacitor array section, and on which switching control is performed based on the time-varying code data.

7. The A/D conversion circuit according to claim 6, further comprising:

a time-varying code data generation section adapted to generate the time-varying code data, wherein the time-varying code data generation section outputs a value varying every A/D conversion timing or every plurality of A/D conversion timings within a data range of the lower-bit data of the successive approximation data as the time-varying code data.

8. An electronic apparatus, comprising:

the A/D conversion circuit according to claim 1.

9. An A/D conversion method in a successive approximation A/D conversion circuit having a comparison circuit, a successive approximation register, and a D/A conversion circuit, the method comprising:

generating a code signal corresponding to time-varying code data;

performing one of a process of comparing a D/A output signal from the D/A conversion circuit with a first addition signal that is provided as a sum of a sampled signal of an input signal and the code signal and a process of comparing the sampled signal with a second addition signal that is provided as a sum of the D/A output signal and the code signal; and outputting output data obtained based on successive approximation result data from the successive approximation register and the code data as A/D conversion data of the input signal.

* * * * *